(12) United States Patent
Fulde et al.

(10) Patent No.: US 12,425,038 B2
(45) Date of Patent: Sep. 23, 2025

(54) SUCCESSIVE APPROXIMATION REGISTER ANALOG-TO-DIGITAL CONVERTER

(71) Applicant: Intel Corporation, Santa Clara, CA (US)

(72) Inventors: Michael Fulde, Weil (DE); Harneet Khurana, Cupertino, CA (US); Matteo Camponeschi, Villach (AT); Patrizia Greco, Villach (AT); Christian Lindholm, Villach (AT); Martin Clara, Santa Clara, CA (US); Giacomo Cascio, Villach (AT)

(73) Assignee: Intel Corporation, Santa Clara, CA (US)

( * ) Notice: Subject to any disclaimer, the term of this patent is extended or adjusted under 35 U.S.C. 154(b) by 762 days.

(21) Appl. No.: 17/645,755

(22) Filed: Dec. 23, 2021

(65) Prior Publication Data

US 2023/0208427 A1 Jun. 29, 2023

(51) Int. Cl.
*H03M 1/12* (2006.01)
*H03M 1/00* (2006.01)
*H03M 1/06* (2006.01)

(52) U.S. Cl.
CPC ......... *H03M 1/0682* (2013.01); *H03M 1/002* (2013.01)

(58) Field of Classification Search
CPC ............................ H03M 1/0682; H03M 1/002
USPC .................................................. 341/172, 155
See application file for complete search history.

(56) References Cited

U.S. PATENT DOCUMENTS

| | | | |
|---|---|---|---|
| 9,496,888 B1 * | 11/2016 | Sharma | H03M 1/38 |
| 10,594,308 B1 * | 3/2020 | Sun | H03M 1/0607 |
| 11,711,089 B2 * | 7/2023 | Sharma | H03M 1/0675 |
| | | | 341/118 |

OTHER PUBLICATIONS

C. Chan, Y. Zhu, I. Ho, W. Zhang, S. U and R. P. Martins, "16.4 A 5mW 7b 2.4GS/s 1-then-2b/cycle SAR ADC with background offset calibration," 2017 IEEE International Solid-State Circuits Conference (ISSCC), 2017, pp. 282-283, doi: 10.1109/ISSCC.2017.7870371.

(Continued)

*Primary Examiner* — Peguy Jean Pierre
(74) *Attorney, Agent, or Firm* — SPL Patent Attorneys PartG mbB; Yong Beom Hwang

(57) ABSTRACT

A successive approximation register (SAR) analog-to-digital converter (ADC) includes a plurality of differential capacitive digital-to-analog converters (C-DACs), comparators, and an SAR controller. Each differential C-DAC comprises a pair of C-DACs for positive and negative polarities and each C-DAC comprises a capacitor array. A capacitor for each bit position may include a pair of equal-sized capacitors. Each outer comparator is coupled to one of the differential C-DACs and the middle comparator is coupled to a differential output node pair of C-DACs from two differential C-DACs. The SAR controller generates a control signal for the differential C-DACs for each conversion step based on outputs of the comparators. The outputs of the comparators are provided to the differential C-DACs as the control signal without encoding. Single-bit/cycle shorting switches for shorting top plates of capacitors of the C-DACs of same polarity may be closed during a single-bit/cycle conversion.

16 Claims, 17 Drawing Sheets

(56) References Cited

OTHER PUBLICATIONS

B. P. Ginsburg and A. P. Chandrakasan, "An energy-efficient charge recycling approach for a SAR converter with capacitive DAC," 2005 IEEE International Symposium on Circuits and Systems, 2005, pp. 184-187 vol. 1, doi: 10.1109/ISCAS.2005.1464555.

Y. Chen et al., "Split capacitor DAC mismatch calibration in successive approximation ADC," 2009 IEEE Custom Integrated Circuits Conference, 2009, pp. 279-282, doi: 10.1109/CICC.2009.5280859.

J. Song, X. Tang and N. Sun, "A 10-b 2b/cycle 300MS/s SAR ADC with a single differential DAC in 40nm CMOS," 2017 IEEE Custom Integrated Circuits Conference (CICC), 2017, pp. 1-4, doi: 10.1109/CICC.2017.7993700.

* cited by examiner

SUCCESSIVE APPROXIMATION REGISTER ANALOG-TO-DIGITAL CONVERTER

BACKGROUND

A successive approximation register (SAR) analog-to-digital converter (ADC) constitutes a very power efficient class of ADC circuits. SAR ADCs display almost digital scaling across technology nodes and are therefore very attractive for the implementation of highly integrated digital transceivers in advanced complementary metal oxide semiconductor (CMOS) technology generations. However, the power and area efficiency of an SAR ADC comes at the cost of reduced conversion speed. Individual analog voltage samples are processed in a sequential manner, by comparing in each step the sampled voltage with a capacitively divided reference voltage provided by the specifically arranged capacitive digital-to-analog converter (C-DAC) in the feedback loop of the SAR ADC, which also holds the current input voltage sample. The result of this comparison is then fed back to the C-DAC, which subsequently changes its output for the next comparison step, such that the difference between the sampled input voltage and the capacitive divider output voltage becomes ideally smaller after each comparison, until the final accuracy is reached after N conversion cycles (in a single-bit SAR converter) representing N raw decisions. Because of possible redundancy in each decision, the N raw decisions may correspond to a binary resolution of B<N bits. In this case, after the SAR conversion process the N raw decisions are mapped to the binary B bits (B≤N), for example by a digital look-up table (LUT).

To be able to process high-frequency input signals, time-interleaving may be applied in ADC. The ADC includes a number (P) of sub-ADCs that each samples the input signal sequentially with the rate fs/P and sampling time skew n/fs, n=0 . . . P−1, fs being the sampling rate of the time-interleaved ADC. At the output of the time-interleaved ADC the data streams of the individual sub-ADCs are combined into the time-interleaved ADC data stream of sample rate fs. Since SAR ADCs are relatively slow with conversion, e.g., in comparison with pipeline-ADCs, the number P of required sub-ADCs can be high for multi-GS/s time-interleaved ADCs. In time-interleaved ADCs with single-stage sample and hold (S/H), i.e., the sub-ADCs directly sample the analog input voltage, the analog ADC buffer should drive P parallel S/H-circuits, and the sub-ADCs individually sample the input voltage P/fs seconds apart. With increasing P, the buffer drive requirements also become increasingly difficult, generally leading to substantially increased power dissipation in the analog front-end.

In order to solve these problems, a hierarchical S/H architecture may be used instead of single-stage S/H. In this way the sampling process is spread out over multiple stages, with each sampler in each stage only driving a limited number of next-level samplers, and finally sub-ADCs. Alternatively, a faster sub-ADC architecture, e.g., pipeline-ADC, may be used.

The hierarchical S/H adds noise (multiple kT/C terms), requires intermediate analog buffers that add noise and nonlinearity, and may attenuate the sampled input signal. Pipeline-ADCs are more difficult to linearize because of the increased number of stages and the potentially nonlinear residue amplification.

BRIEF DESCRIPTION OF THE FIGURES

Some examples of apparatuses and/or methods will be described in the following by way of example only, and with reference to the accompanying figures, in which.

DETAILED DESCRIPTION

Figure 1A:
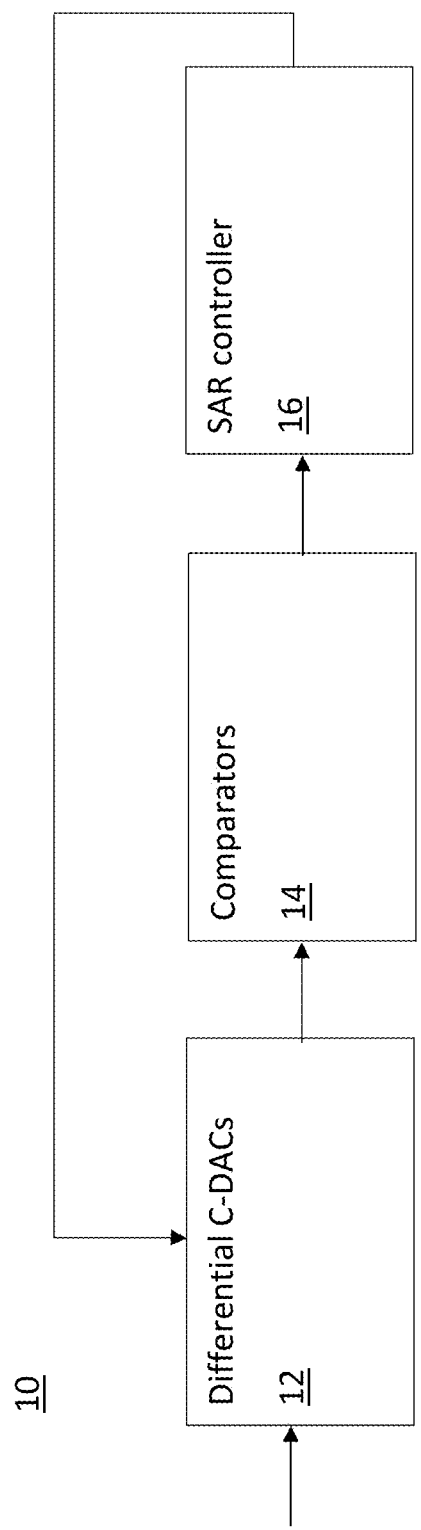
FIG. 1A is a schematic block diagram of an example SAR ADC.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Examples are disclosed for a multibit/cycle SAR ADC. The disclosed example schemes for the multibit/cycle SAR ADC architecture allow the implementation of a power efficient and reasonably fast single-loop SAR ADC that may be used in a time-interleaved ADC.

In some examples, special preset using thermometer coding of a set of appropriately split capacitor C-DACs and associated feedback signals are used during multibit/cycle conversions. The thermometer coding of the multibit/cycle capacitors and associated feedback signals eliminate decoding logic delays and speed up the multibit/cycle SAR-loop.

In some examples, the sum of individual capacitor banks used during the multibit/cycle conversions may be used for the single-bit/cycle decisions by placing additional switches that are closed during the single-bit decision cycles. This effectively converts the individual capacitor banks used during the multibit/cycle conversions into a single big capacitor bank during the single-bit conversion cycles. Use of the total sum of all available individual capacitor banks, which are required for the multibit conversion cycles, for the single-bit conversion cycles minimizes the sampled noise (kT/C-noise), thus maximizing the dynamic range for a given (total) sampling capacitor size.

In some examples, all available comparators may be used for the single-bit decisions late in the SAR conversion cycle with results averaging, e.g., by employing majority voting. With the individual capacitor banks shorted during the single-bit/cycle decisions, all comparators have the same input voltage. By evaluating all results, which ideally should be the same, an improvement in comparator noise can be achieved, up to 1/sqrt(N), with N comparators working in parallel on the same input voltage.

In some examples, a dummy comparator may be added for balanced loading of the capacitively interpolated C-DACs. The dummy comparator balances the loading of the top-plate nodes of the capacitively interpolated C-DACs to avoid unwanted common-mode shifts during the multibit/cycle conversion process.

In some examples, a full extra comparator which is inactive during the multibit/cycle steps for balanced loading, but active for extra decision bit during single-bit/cycle conversion steps may be used. Making the dummy comparator a full comparator and activating it during the single-bit/cycle conversion steps generate an additional decision for the same input residue voltage during these noise critical last conversion steps. This allows even more effective averaging of the comparator noise during single-bit/cycle conversion steps.

In some examples, a background offset tracking cycle may be used for the "middle" comparator, updated during a special auto-zero cycle at the end of the SAR conversion cycle by early activation of the C-DAC top-plate shorting switch before the input signal sampling switches to provide the zero input for the comparators. By minimizing the offset of the middle comparator with an extra auto-zero cycle, i.e., by shorting the comparator inputs at the end of the SAR conversion cycle, it not only suppresses the offset of the "middle" comparator, but also reduces DC-offset variation, i.e., 1/f-noise of the "middle" comparator, at least for frequencies up to the closed-loop bandwidth of the offset tracking loop. With the offset tracking loops of the "outer" comparators in place, the offset and 1/f-noise of the "outer" comparators are effectively suppressed (within their respective loop bandwidth), because these loops track the offset and 1/f-noise of the (corrected) "middle" comparator.

FIG. 1A is a schematic block diagram of an example SAR ADC 10. The SAR ADC 10 includes a plurality of differential C-DACs 12, a plurality of comparators 14, and an SAR controller 16. Each of the plurality of differential C-DACs 12 comprises a pair of C-DACs for positive and negative polarities and each C-DAC comprises a capacitor array including a plurality of capacitors coupled in parallel to an output node of each C-DAC. A capacitor for each bit position in each C-DAC may include a pair of equal-sized capacitors.

The plurality of comparators 14 include two or more outer comparators and at least one middle comparator. Each outer comparator is coupled to one of the differential C-DACs and the middle comparator is coupled to a differential output node pair of C-DACs from two differential C-DACs. Each outer comparator receives its differential inputs directly from a single differential C-DAC, and the middle comparator receives its differential inputs from two differential C-DACs via capacitive interpolation.

The SAR controller 16 is configured to generate a control signal for the plurality of differential C-DACs for each conversion step based on outputs of the comparators 14. The SAR controller 16 is configured to perform one or more multi-bit per cycle conversions and then at least one single-bit per cycle conversion for converting an analog input signal to a digital signal. The outputs of the comparators 14 are provided to the differential C-DACs as the control signal without encoding.

In some examples, the SAR controller 16 is configured to pre-charge one of the pair of capacitors in each bit position to a positive reference voltage and the other of the pair of capacitors in each bit position to a negative reference voltage and toggle a most significant bit of multiple bits under evaluation of the differential C-DACs to the positive reference voltage and the negative reference voltage, respectively before strobing the comparators.

In some examples, the SAR ADC may further include single-bit/cycle shorting switches for shorting top plates of capacitors of the C-DACs of same polarity. The single-bit/cycle shorting switches may be closed during a single-bit/cycle conversion. With this scheme, the total sum of all available individual capacitor banks, which are required for the multibit conversion cycles, may be used for the single-bit conversion cycles.

With the individual capacitor banks shorted during the single-bit/cycle conversion, all comparators have the same input voltage. In this case, the SAR controller may be configured to generate the control signal based on outputs of all comparators during the single-bit/cycle conversion. The SAR controller may be configured to generate the output of the comparators by majority voting of the outputs of all comparators.

In some examples, the SAR ADC may further include additional comparator coupled to another differential output node pair from the two differential C-DACs for the load balancing during the multi-bit/cycle conversions. The additional comparator may be a dummy comparator. Alternatively, the additional comparator may be a full comparator coupled to another differential output node pair from the two differential C-DACs and configured to generate an output during the single-bit/cycle conversion.

In some examples, the SAR ADC may further include a feedback loop for the middle comparator. A top-plate shorting switch for shorting top plates of the pair of C-DACs for each differential C-DAC may be closed before an input sampling switch for sampling the analog input signal to provide an autozero time window, and a DC offset correction of the middle comparator may be performed via the feedback loop based on an output generated by the middle comparator during the autozero time window.

In some examples, the SAR ADC may further include a second feedback loop for each outer comparator. The DC offset correction may be performed for each outer comparator via the second feedback loop based on an output generated by each outer comparator during the autozero time window. In some examples, the DC offset correction for the outer comparator may be performed based on a difference between the output generated by the middle comparator and the output generated by each outer comparator. The second feedback loop may be updated based on the difference between the outputs of the outer comparator and the middle comparator during at least one of the previous single-bit/cycle conversion steps.

The top plates of the capacitors in each C-DAC are coupled to the output node in parallel and the analog input signal may be sampled to bottom plates of the capacitors. The capacitor array in each C-DAC may be split into two segments that are coupled via a bridge capacitor. The SAR ADC may be included in a user equipment, a base station, etc.

Figure 1B:
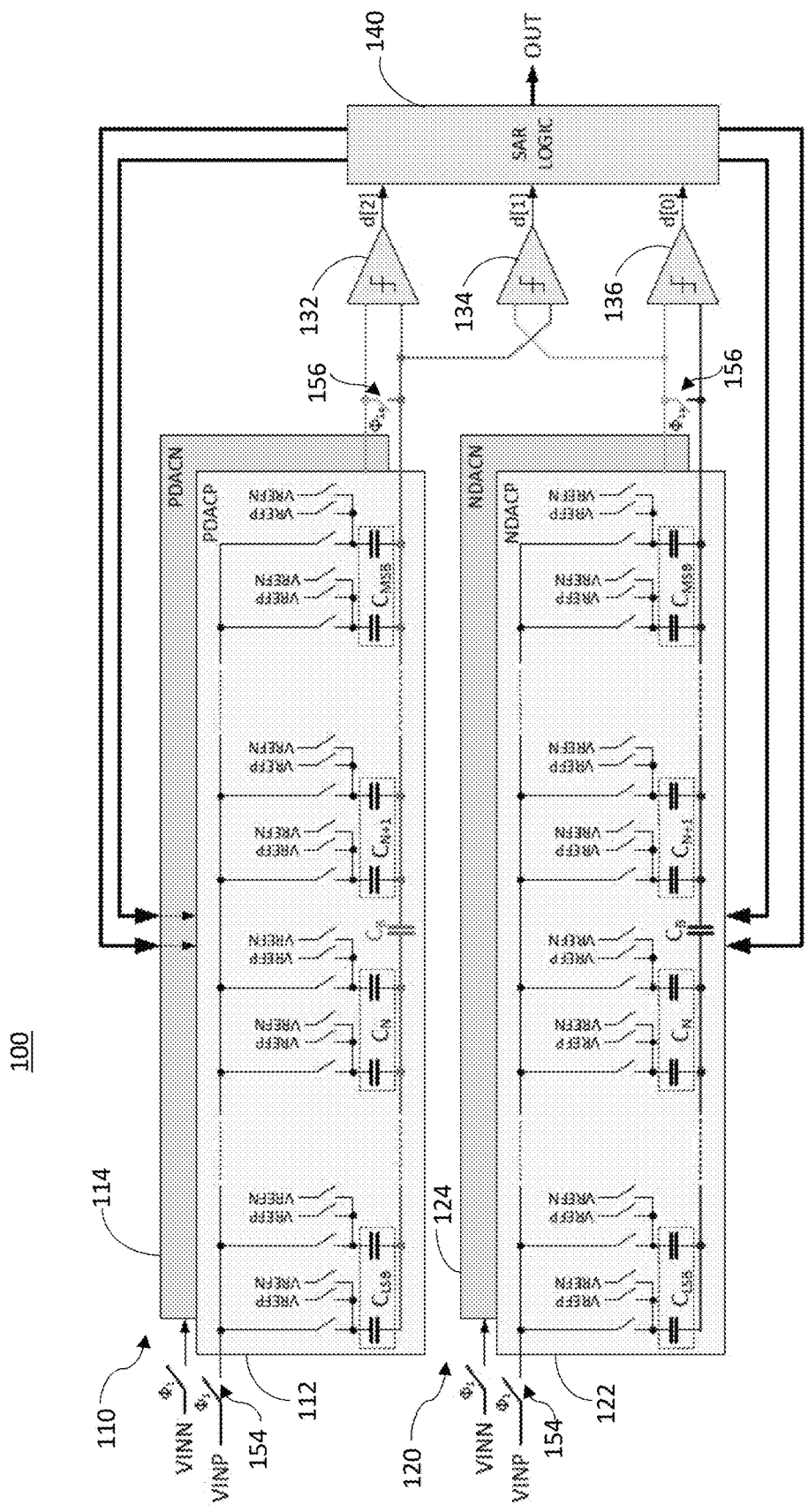
FIG. 1B shows an example SAR ADC for early 2b/cycle conversion followed by late 1b/cycle conversion with bottom plate sampling.

FIG. 1B shows an example SAR ADC 100 for early 2b/cycle conversion followed by late 1b/cycle conversion with bottom plate sampling. The SAR ADC 100 includes two differential C-DACs 110, 120 (DAC-1 and DAC-2), three comparators 132, 134, 136 (referred to as top, middle, and bottom comparators), an SAR logic block 140, and a plurality of switches.

The differential C-DAC 110 includes a pair of C-DACs 112, 114 for positive and negative polarities, and the differential C-DAC 120 includes a pair of C-DACs 122, 124 for positive and negative polarities. Each C-DAC 112/114, 122/124 includes a capacitor bank including a plurality of capacitors coupled in parallel to a common node. The top plates of the capacitors are coupled to the common node in parallel and the bottom plates of the capacitors are selectively coupled via switches to the input signal (VINP, VINN) or to the positive or negative reference voltage (VREFP and VREFN).

The top comparator 132 is coupled to the differential C-DAC 110, the bottom comparator 136 is coupled to the differential C-DAC 120, and the middle comparator 134 is coupled to a differential output node pair from the two differential C-DACs 110, 120. More specifically, the outputs of the C-DACs 112 and 114 are coupled to the positive and negative terminals of the comparator 132, respectively, and the outputs of the C-DACs 122 and 124 are coupled to the positive and negative terminals of the comparator 136, and the output of the C-DAC 112 and the output of the C-DAC 124 are coupled to the positive and negative terminals of the comparator 134.

The SAR logic block 140 is configured to generate a feedback signal to the differential C-DACs 110, 120 for each conversion cycle based on the outputs of the comparators 132, 134, 136.

In the sampling phase, the bottom plates of both differential C-DACs 110, 120 sample the same differential input signal (VINP and VINN) as the input sampling switches ($\Phi_1$) 154 are closed. This is followed by the multi-bit/cycle conversion phase (2b/cycle in this example). In the first cycle of the multi-bit/cycle conversion phase, the two differential C-DACs 110, 120 are pre-charged differently to generate the two required different differential thresholds, which are input to the top comparator 132, and the bottom comparator 136. The middle comparator 134 receives its differential input from the single polarity sides of the two differential C-DACs 110, 120.

This arrangement for the middle comparator 134 is commonly called capacitive interpolation. The top and bottom comparators 132, 136 get their inputs from the two differential C-DACs 110, 120 and the middle comparator 134 gets its differential inputs through the capacitive interpolation of the two C-DAC voltages. The threshold setup through the differential C-DAC 110 is at the ¾ mark of the remaining SAR search range (e.g., ¾ of the full range at the first cycle), and threshold setup through the differential C-DAC2 120 is at the ¼ mark of the remaining SAR search range (e.g., ¼ of the full range at the first cycle), while the threshold through the capacitive interpolation is setup at the midpoint of the remaining SAR search range (e.g., ½ of the full range at the first cycle).

Instead of a single comparator used in a 1b/cycle SAR, a 2b midstep flash ADC including the three comparators 132, 134, 136 outputs three raw decision bits d[0], d[1], d[2] representing a two-bit thermometer code in each conversion step. The decision levels for the three comparators 132, 134, 136 are generated at each step, depending on the feedback signal generated by the comparator decisions during the previous conversion step, by the two differential capacitive C-DACs 110, 120 with additional capacitive interpolation for the middle comparator 134 (i.e., a zero-threshold comparator).

The C-DACs 112/114, 122/124 may employ a split-capacitor structure. The capacitor for each bit position in the C-DACs 112/114, 122/124 may be split into two equal size capacitors, as shown in FIG. 1. Each C-DAC 112/114, 122/124 may include a bridge capacitor to simplify the physical implementation of the least significant bit (LSB)-section.

The example SAR ADC 100 uses two differential DACs 110, 120 for a two-bit/cycle SAR ADC conversion. The example SAR ADC 100 also uses split-capacitor C-DACs, where capacitors in all bit positions in the capacitor bank are each split into two equal-sized capacitors. The SAR ADC 100 also implements bottom plate sampling such that the analog input signal is sampled to the bottom plates of the capacitors. The C-DACs of the SAR ADC 100 are initialized during the multibit/cycle conversion steps such that the common-mode voltage of the two capacitive C-DACs 110, 120 stays constant and instead the differential-mode voltage is set differently on the two C-DACs 110, 120 (on split-capacitor DACs) to generate the threshold voltages needed for multi-bit/cycle conversion, which will be explained in detail below.

It should be noted that FIGS. 1B-9 show an SAR ADC structure for 2b/cycle conversion as an example. The examples disclosed herein can be applied to an SAR ADC configured to more than two bits per cycle conversion (e.g., 3b/cycle, etc.). For example, an SAR ADC for 3b/cycle conversion may include four differential C-DACs and seven comparators.

Figure 2A:
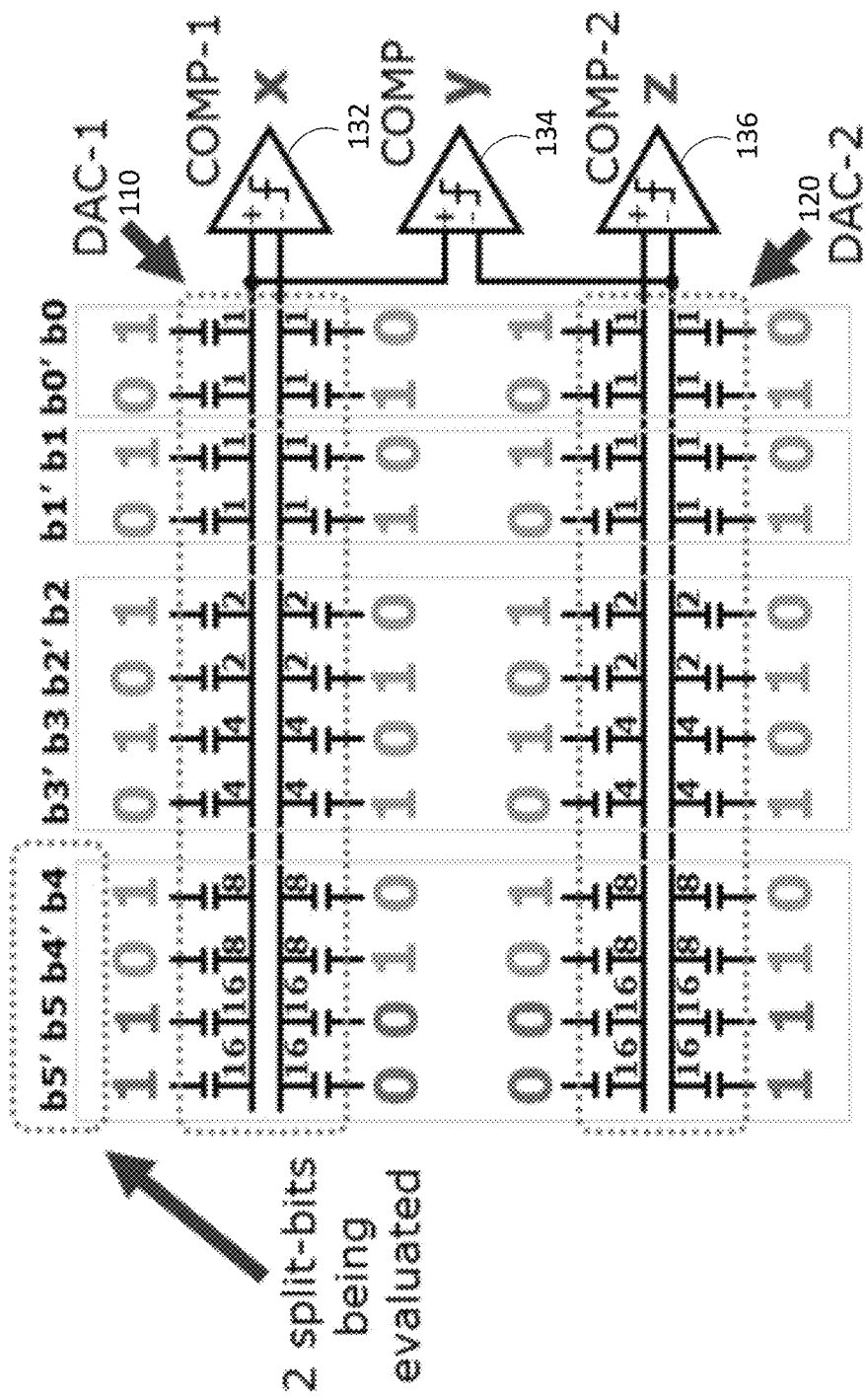
FIG. 2A shows the first 2b/cycle pre-charge phase.
Figure 2B:
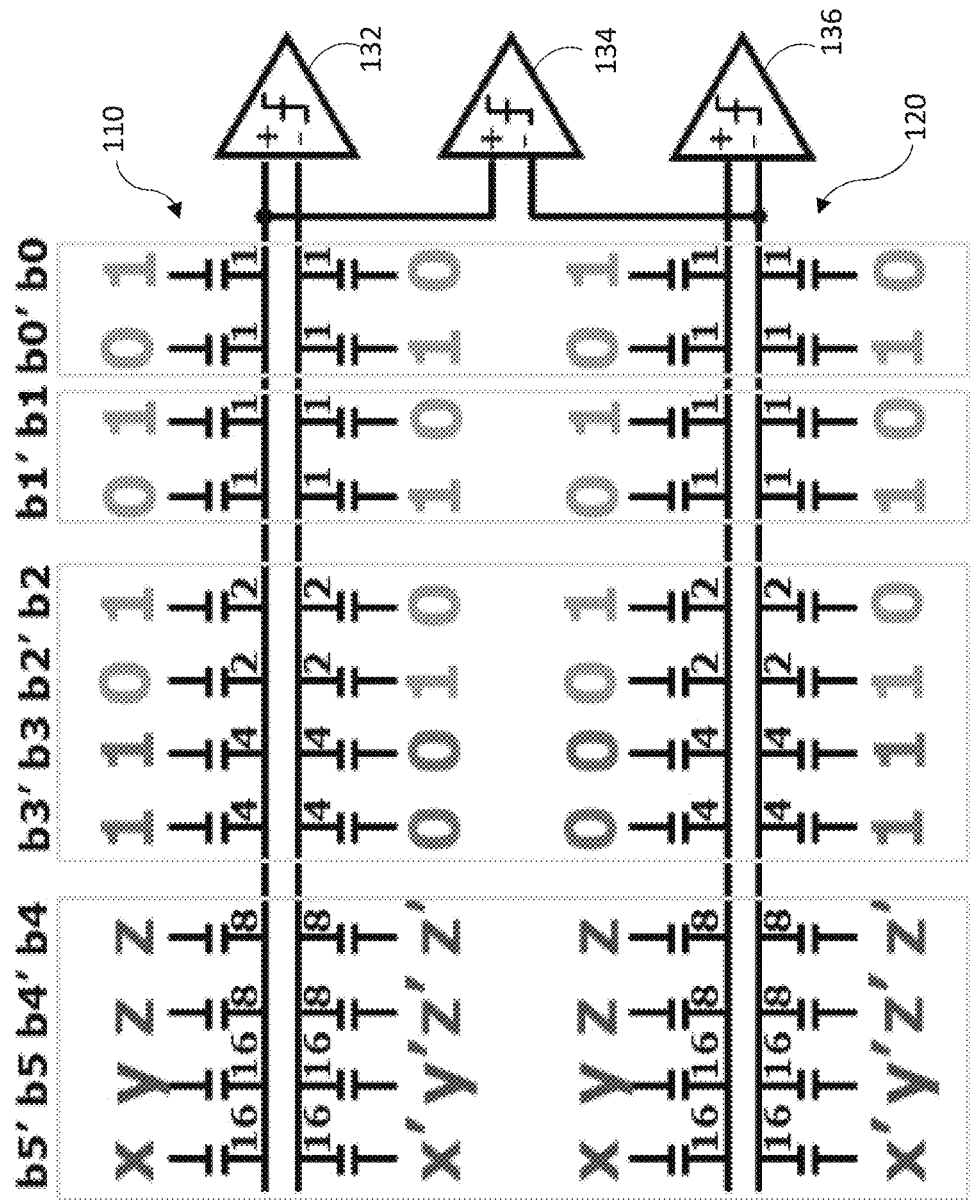
FIG. 2B shows the second 2b/cycle pre-charge phase.

The detailed operation of the C-DACs 110, 120 will be explained with reference to FIGS. 2A and 2B. The example shown in FIGS. 2A and 2B is for two 2b/cycle conversions followed by two 1b/cycle conversions. In the sampling phase, the input signal (VINP and VINN) is sampled to the bottom plates of the differential C-DACs 110, 120 (DAC-1, DAC-2). This is followed by the multi-bit/cycle conversion phase.

FIG. 2A shows the first 2b/cycle pre-charge phase. The C-DACs 110, 120 (DAC-1 and DAC-2) have a split capacitor structure with a capacitor for each bit position split into two equal size capacitors. A half of the split-DAC is pre-charged to VREFP (shown with '1' in the figures) and the other half of the split-DAC is pre-charged to VREFN (shown with '0' in the figures). One of the pair of capacitors in each bit position is charged to VREFP and the other of the pair is charged to VREFN. Then, the MSB ([b5' b5] in this example) of the two bits under evaluation ([b5' b5 b4' b4] in this example) of the differential C-DACs 110 and 120 are toggled to VREFP and VREFN, respectively. The MSB in the positive branch of the differential C-DAC 110 is connected to VREFP and the MSB in the negative branch of the differential C-DAC 110 is connected to VREFN, and the MSB in the positive branch of the differential C-DAC 120 is connected to VREFN and the MSB in the negative branch of the differential C-DAC 120 is connected to VREFP. After pre-charging the differential C-DACs 110, 120, all comparators 132, 134, 136 are strobed, which results in a thermometric code [x y z] ranging from [0 0 0] to [1 1 1] as shown in the FIG. 2A.

FIG. 2B shows the second 2b/cycle pre-charge phase. The bits [b5' b5 b4' b4] are pre-charged to the comparator output [x y z z] and [x' y' z' z'] in the positive and negative branches, respectively, from evaluation in the previous 2-bit cycle. x, y, z and x', y', z' are complementary, respectively. The comparator results may be directly fed to the differential C-DACs 110, 120 without any decoding logic by reconfiguration of the two split-bits into three equal bits as shown in FIG. 2B. In the example, the four bits [b5' b5 b4' b4] are reconfigured into three bits [b5' b5 [b4' b4]] with the combination of [b4' b4] forming the third bit.

During the comparator result feedback, the next 2b/cycle may begin in parallel by connecting the MSB of the next two bits to VREFP and VREFN for differential C-DACs 110, 120, respectively. Bits [b3' b3] are pre-charged and setup for evaluation of the next two bits [b3' b3 b2' b2] for the second 2b/cycle conversion. Bits [b3' b3] of the differential C-DACs 110 and 120 are toggled to VREFP and VREFN, respectively.

The above steps are repeated for all 2b/cycle conversions. After completion of the 2b/cycle conversions, a single-bit/cycle conversion begins. For the single-bit/cycle conversions, the two differential DACs 110, 120 may be joined at their top-plates, by shorting the two positive top-plates and the two negative top-plates.

Figure 3A:
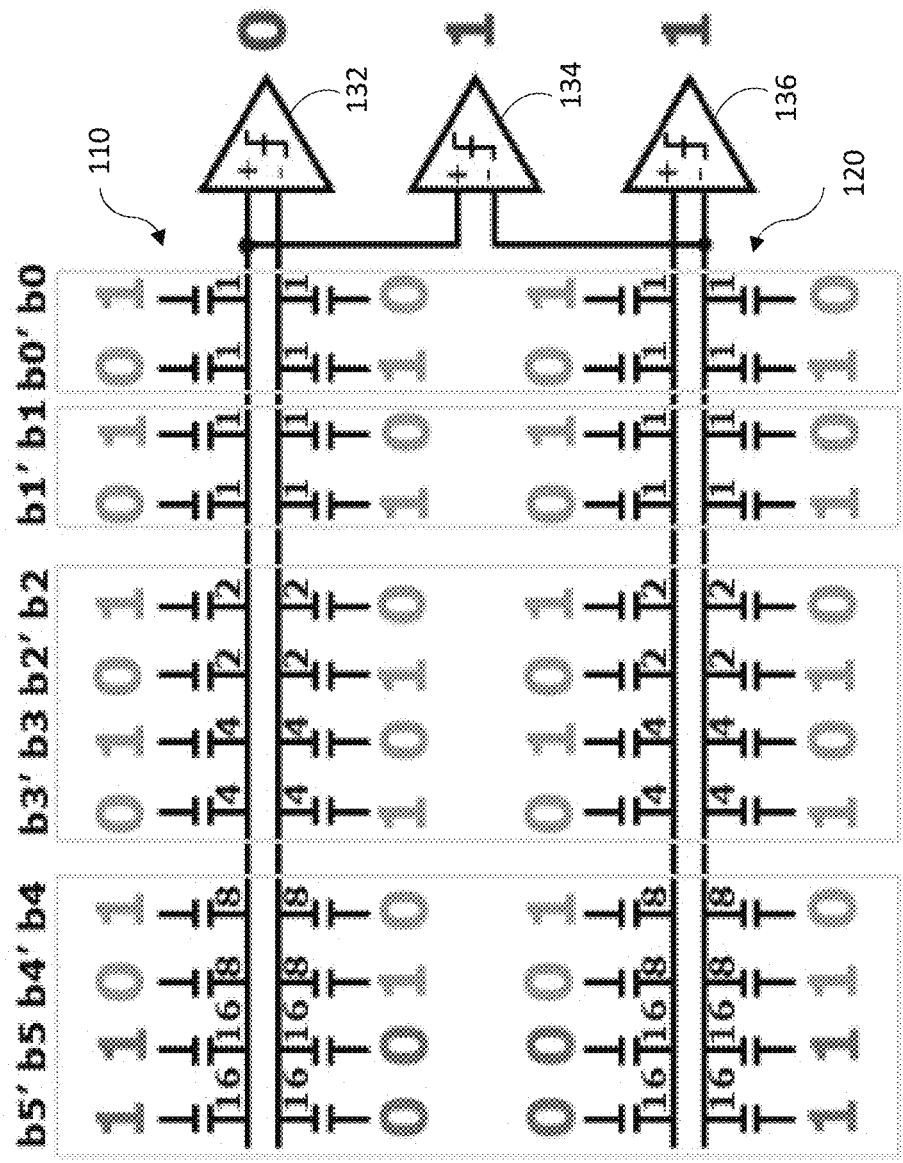
FIGS. 3A-3D show complete bit-cycling and resultant output for two 2b/cycle conversions and two 1b/cycle conversions.
Figure 3B:
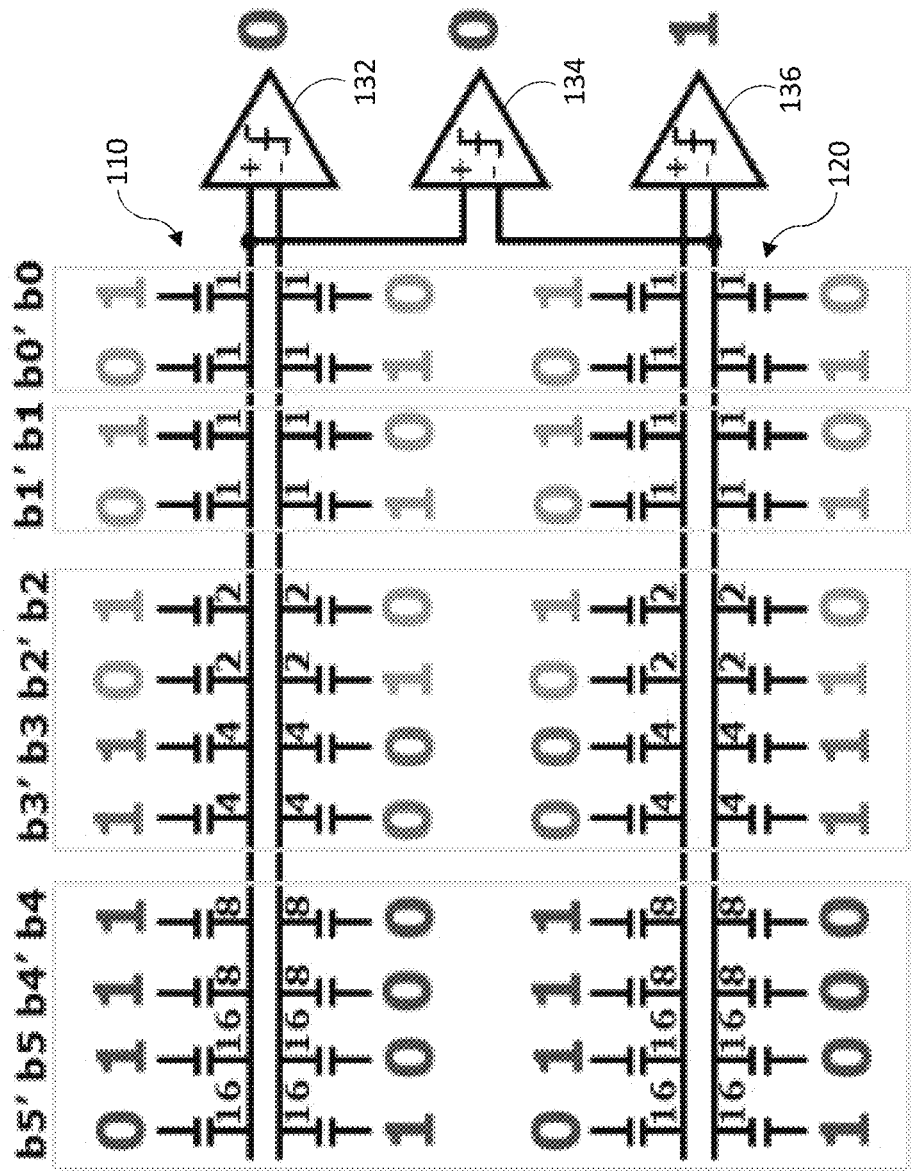
Figure 3C:
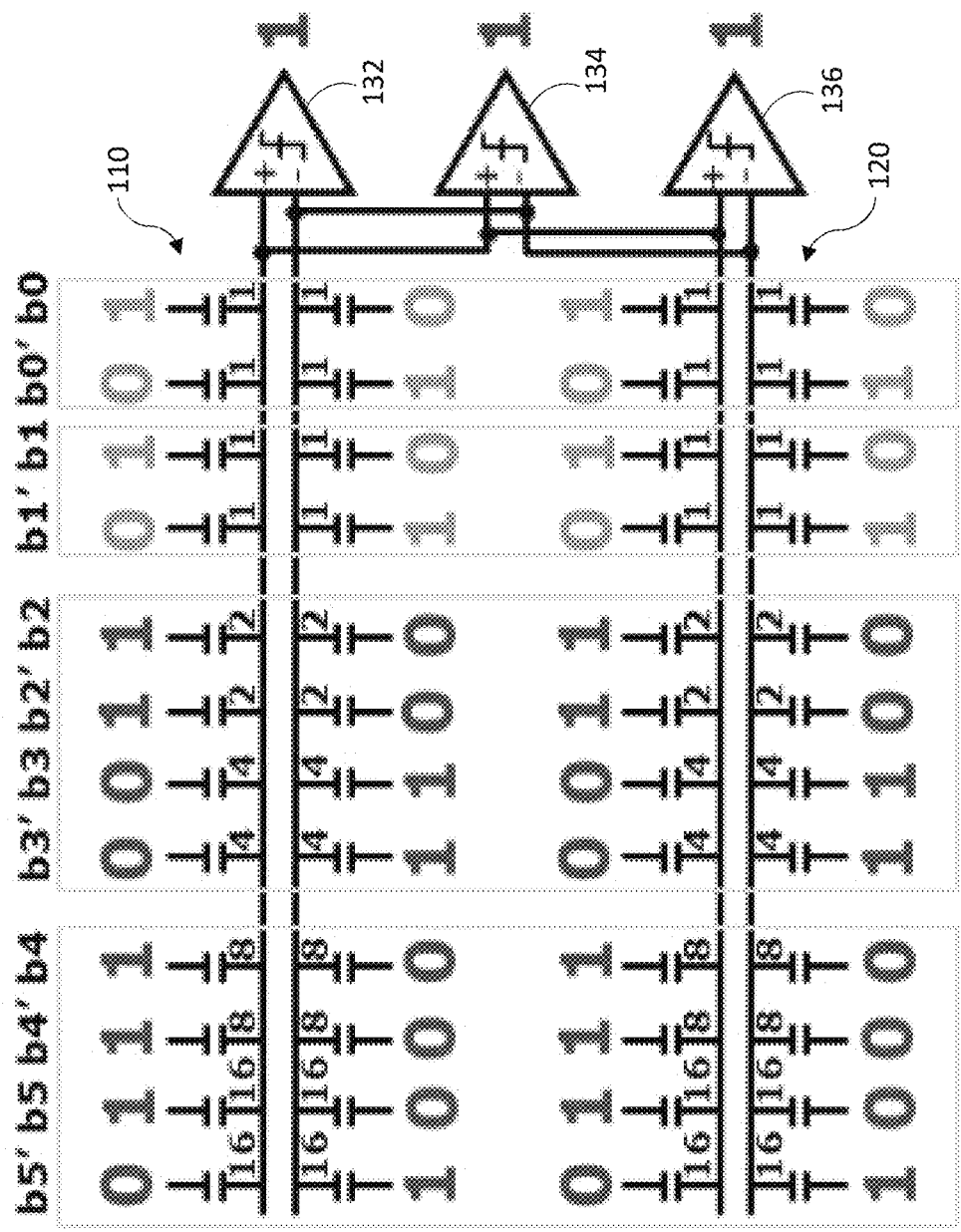
Figure 3D:
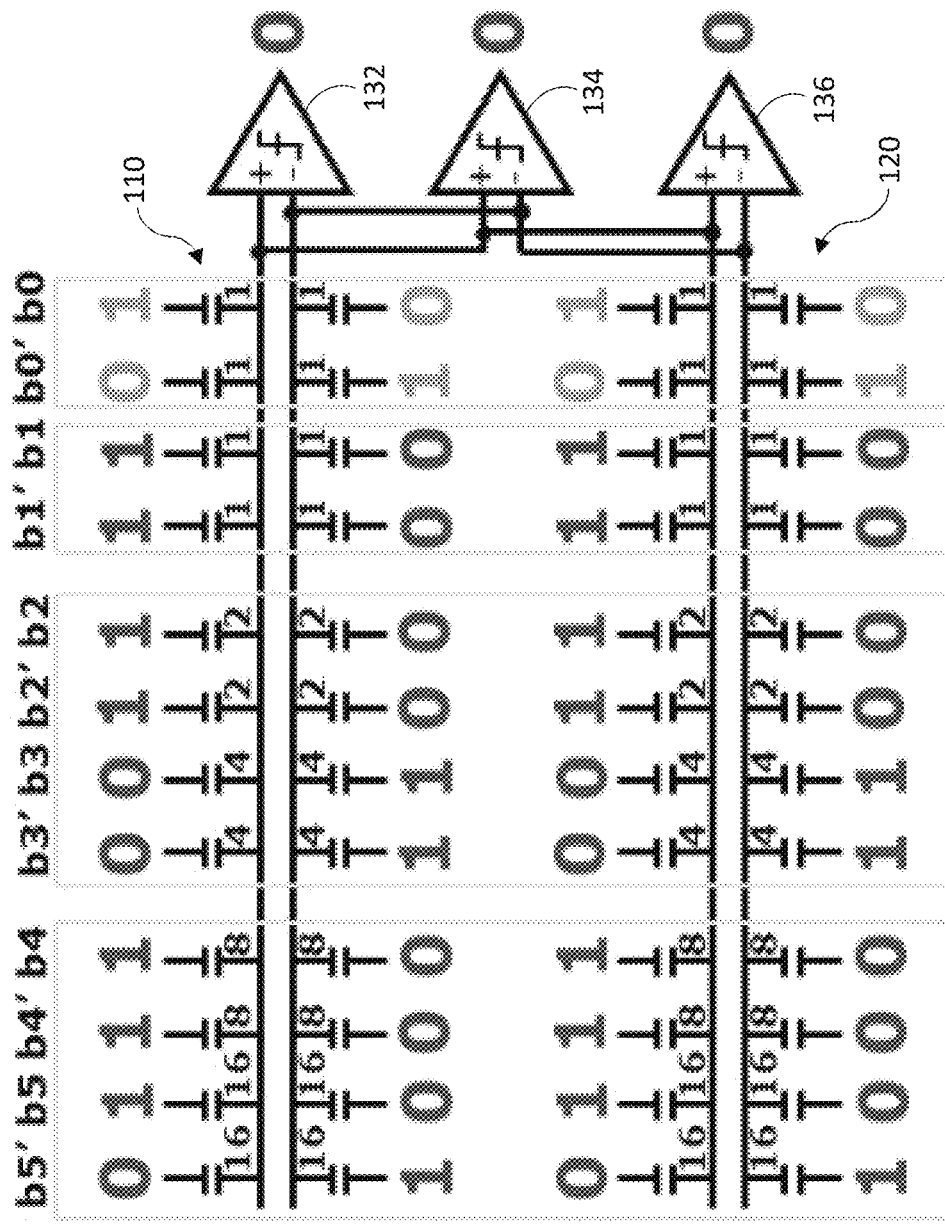

An example of complete bit-cycling and resultant output is shown in FIGS. 3A-3D for two 2b/cycle conversions and two 1b/cycle conversions. The first two 2b/cycle conversions are shown in FIGS. 3A and 3B, and the remaining two 1b/cycle conversions are shown in FIGS. 3C and 3D.

FIG. 3A shows the first cycle of the two 2b/cycle and two 1b/cycle conversions. A half of the differential C-DACs 110, 120 is pre-charged to VREFP (shown with 1) and the other half is charged to VREFN (shown with 0). The differential C-DACs have a split capacitor structure, and one of the pair of capacitors in each bit position is charged to VREFP and the other of the pair is charged to VREFN. Then, the MSB [b5' b5] of the differential C-DACs 110 and 120 is connected to VREFP and VREFN, respectively. Bits [b5' b5] in the positive and negative sides of the differential C-DAC 110 is connected to VREFP and VREFN, respectively, and bits [b5' b5] in the positive and negative sides of the differential C-DAC 120 is connected to VREFN and VREFP, respectively. The comparators 132, 134, 136 are then strobed and outputs a thermometric code, [0 1 1] in this example.

FIG. 3B shows the second cycle of the two 2b/cycle and two 1b/cycle conversions. The previous thermometric comparator output ([0 1 1] in this example) toggles bits [b5' b5 b4' b4] to [0 1 1 1] in the positive side and to [1 0 0 0] in the negative side in the differential C-DACs 110 and 120. The MSB of the next two bits ([b3' b3] in this example) are setup. [b3' b3] in the positive and negative sides of the DAC-1 is connected to VREFP and VREFN, respectively, and [b3' b3] in the positive and negative sides of the DAC-1 is connected to VREFN and VREFP, respectively. The comparators 132, 134, 136 are strobed and output a thermometric code, [0 0 1] in this example.

FIG. 3C shows the third cycle of the conversion, which is a 1b/cycle conversion. The previous thermometric comparator output ([0 0 1] in this example) toggles bits [b3' b3 b2' b2] to [0 0 1 1] in the positive side and to [1 1 0 0] in the negative side in the differential C-DACs 110, 120. The differential C-DACs 110, 120 may be shorted at the beginning of this first 1b/cycle. The top plates of the positive sides of the differential C-DACs 110, 120 may be shorted, and the top plates of the negative sides of the differential C-DACs 110, 120 may be shorted. The comparators 132, 134, 136 (alternatively, only 134) are strobed and all comparators output '1' at the end of this cycle in this example.

FIG. 3D shows the fourth bit-cycle of the conversion, which is also a 1b/cycle conversion. The previous thermometric comparator output [1] toggles bits [b1' b1] to [1 1] in the positive side and to [0 0] in the negative side in the differential C-DACs 110, 120. The comparators 132, 134, 136 (alternatively, only 134) are strobed and all comparators output 0 at the end of this 1b/cycle in this example.

In each conversion step, the threshold levels in a multi-bit/cycle SAR ADC are set by the differential C-DACs (e.g., in the 2b/cycle SAR of FIG. 1, PDACP and NDACP for the positive terminal, and PDACN and NDACN for the negative terminal). PDACP/N and NDACP/N are identical to DAC-1 and DAC-2 in FIG. 2A. The difference between the individual comparator threshold voltages becomes progressively smaller after each conversion step. Since comparator offset and capacitor mismatch in the C-DACs are changing these decision levels, errors in the multi-bit decisions become increasingly likely towards the end of the conversion cycles and can severely limit the achievable accuracy of the ADC. To circumvent this problem, as disclosed above, an early multi-bit/cycle and late single-bit/cycle conversions are used. At a certain predetermined point in the conversion cycles (after a certain number of 2b/cycle conversion steps) the SAR ADC logic modifies itself automatically from the 2b/cycle conversion to the 1b/cycle conversion by switching off the "outer" comparators 132, 136 and changing the way the C-DACs operate (e.g., single bit feedback instead of multibit feedback) for the last one or more conversion steps. Alternatively, all comparators may receive the same input (by closing the 1b cycle shorting switches 152) and the comparator outputs may be interpreted differently (e.g., averaging all comparator outputs).

In some examples, the same-polarity top plates of the differential C-DACs 110, 120 may be shorted during the single-bit/cycle conversion steps. In the examples, the sum of individual capacitor banks used during the multibit/cycle conversions is used for the single-bit/cycle decisions by placing additional switches that are closed during the single-bit decision cycles.

Figure 4:
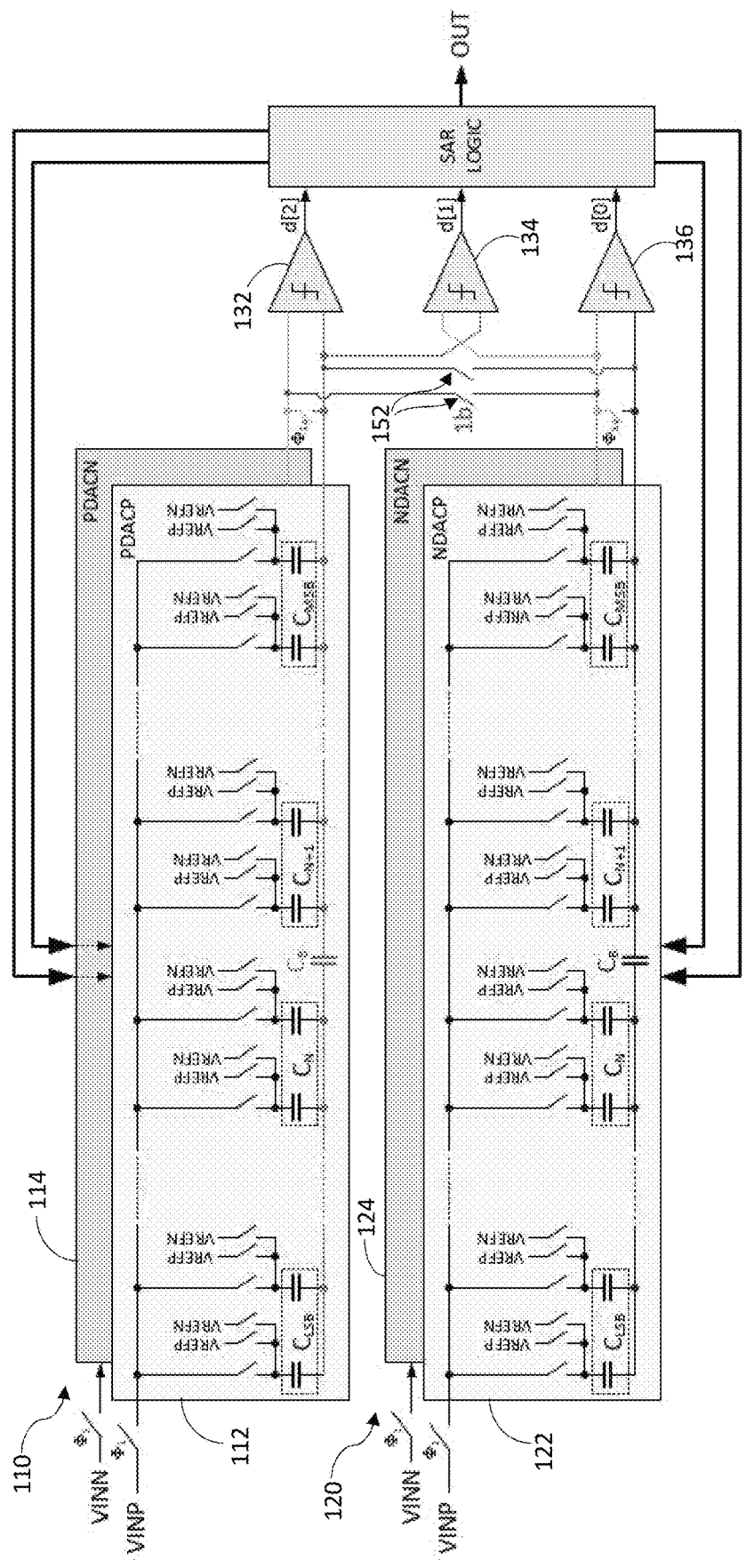
FIG. 4 shows shorting the top-plate nodes of the differential C-DACs for a 1b/cycle operation.

FIG. 4 shows shorting the top-plate nodes of the differential C-DACs for a 1b/cycle operation. After a predetermined number of 2b/cycle conversions, the top plate nodes of the same polarity halves of the differential C-DACs 110, 120 (i.e., C-DACs 112 and 122, and C-DACs 114 and 124) may be shorted using the 1b cycle shorting switches 152, thereby creating a new combined differential C-DAC of double capacitor size for the 1b/cycle conversion steps. The capacitor settings from the previous 2b/cycle decisions may be kept and the final 1b/cycle decisions may be performed with the combined differential C-DAC. The SAR logic needs to be configured differently to apply the appropriate feedback signals to the combined C-DAC during the 1b/cycle conversion steps. Because the total sampling capacitance is used during the last noise critical 1b/cycle conversion steps, the sampling noise performance of the ADC with respect to the initially sampled noise (kT/C-noise) can be improved, i.e., the sampling noise in the final conversion result is calculated with the total sampling capacitor size, initially distributed across a number of individual C-DACs, e.g., 2 C-DACs in the multibit/cycle implementation of FIG. 1.

In some examples, instead of turning off the "outer" comparators 132, 136 during the 1b/cycle conversion steps, a further performance improvement in terms of ADC noise may be achieved by enabling all comparators 132, 134, 136 during the 1b/cycle conversion steps and evaluating all comparator outputs. With the top-plate nodes shorted, all comparators 132, 134, 136 see the same input voltage and have a nominal decision threshold of zero. Therefore, ideally they should all generate the same output. In reality, due to noise and mismatch this might not be the case, especially for the very small residue values during the last decision steps. Therefore, in some examples, the 1b/cycle decisions applied to the feedback and, finally to the ADC output, may be generated by averaging (e.g., by majority voting) of all comparator outputs. This scheme may incur a small increase in power dissipation since all comparators remain active for the single-bit/cycle conversion steps. However, this potential power penalty would be minimal since the comparators can be designed with the minimum possible size.

The capacitive interpolating C-DAC structure has a drawback. The two differential C-DACs 110 and 120 are not loaded symmetrically during the 2b/cycle conversion steps. This can lead to common-mode shifts during the multibit/cycle steps and have a negative influence on the converter performance.

Figure 5:
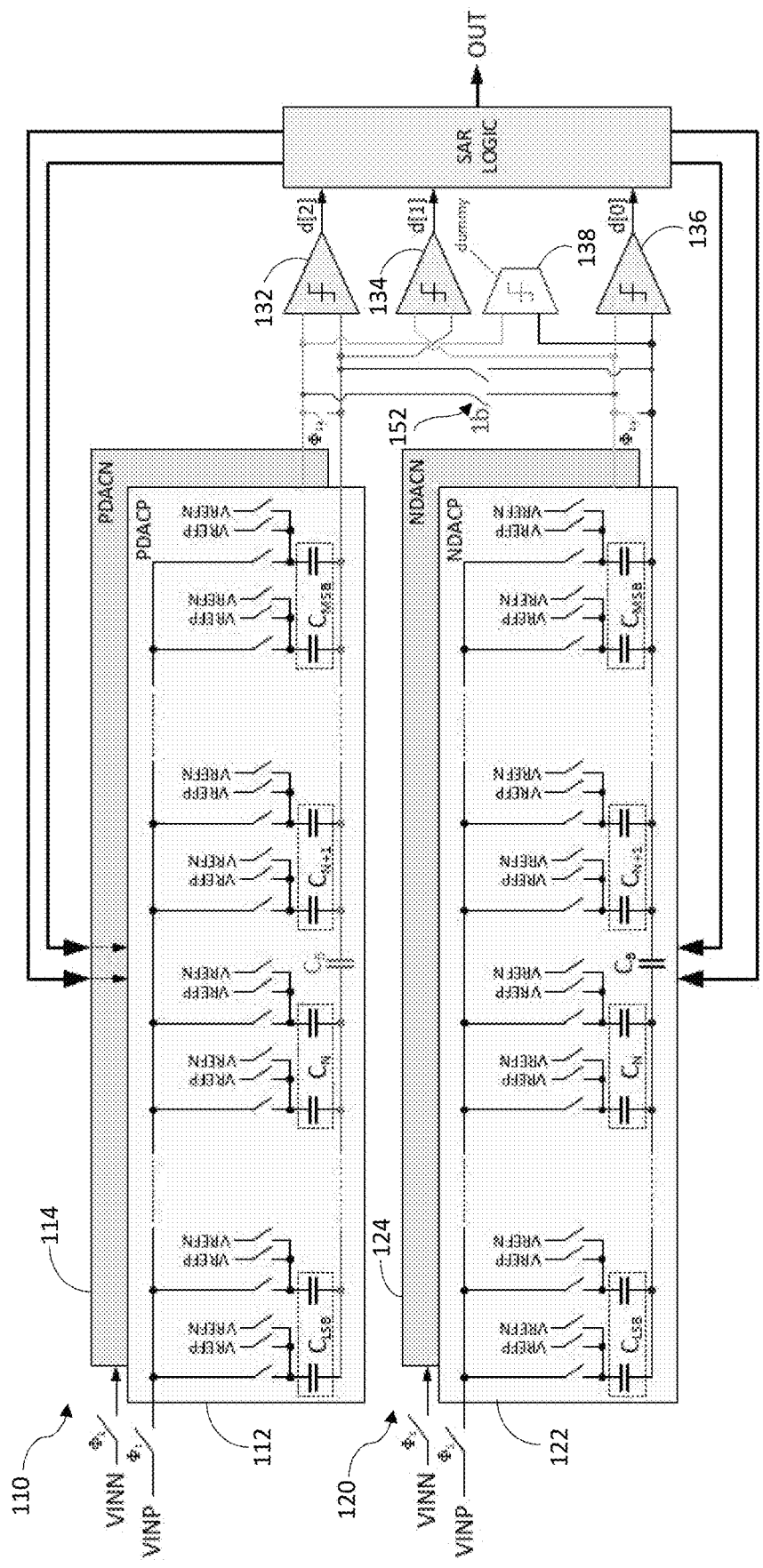
FIG. 5 shows an SAR ADC with a dummy comparator.

In some examples, a dummy comparator 138 (for example, a copy of the input stage of the multistage comparator 132, 134, 136) may be added for balanced loading of the interpolated C-DAC architecture (e.g., to replicate the loading of the middle comparator for the other differential output node pair). FIG. 5 shows an SAR ADC with a dummy comparator 138. The middle comparator 134 is coupled to one differential output node pair from the differential C-DACs 110, 120, and the dummy comparator 138 is coupled to another differential output node pair from the two differential C-DACs 110, 120. The dummy comparator input stage may be switched into a different state during the 1b/cycle conversion steps, where it is actually not needed (because the top-plate nodes of the independent C-DACs are connected during the 1b/cycle conversion phase), for example, to minimize the input capacitance of the dummy comparator input stage during the last 1b/cycle conversion steps.

Figure 6:
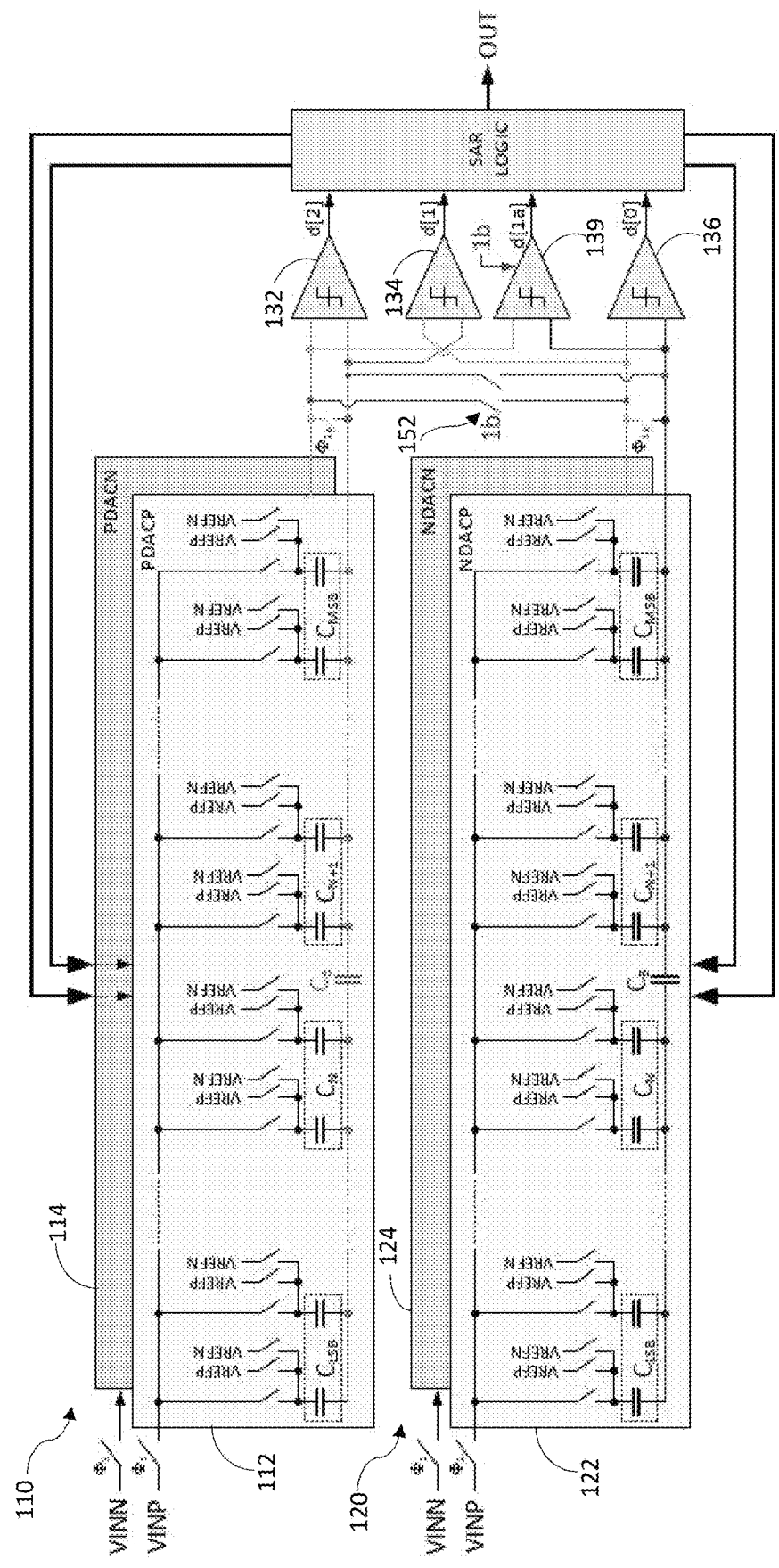
FIG. 6 shows an SAR ADC with a full extra comparator.

In some examples, the extra comparator (the dummy comparator 138) for balanced loading of the capacitively interpolated C-DACs during the 2b/cycle conversion steps may provide an additional decision bit during the 1b/cycle conversion steps. FIG. 6 shows an SAR ADC with a full extra comparator 139. The extra comparator 139 introduced to balance the loading of the top-plate nodes of the C-DACs during the 2b/cycle conversion steps may be implemented as a full comparator that can be activated by the control signal "1b" during the 1b/cycle conversion steps. The extra comparator 139, which works as a dummy load during the 2b/cycle steps, generates an extra decision bit d[1a] during the 1b/cycle steps. Because the top-plate nodes are joined during the 1b/cycle conversion steps, the extra comparator 139 also sees the same input voltage and delivers an extra decision bit that can be used to further increase the accuracy of the ADC, i.e., the averaging of 4 comparators during the last 1b/cycle conversion steps reduces the comparator noise by $1/\sqrt{4}=\frac{1}{2}=-6$ dB. This improvement comes at a minimum increase in overall power dissipation and majority vote logic complexity that generates the decision bit with now 4 nominally equal inputs, instead of 3.

The last 1b/cycle conversion step marks the end of the SAR conversion cycle. At this moment, the 1b/cycle shorting switches 152 (marked with "1b") for the C-DAC top-plate nodes are still closed. In order to take the next sample, the input sampling switches ($\Phi_1$) 154, as well as the top-plate sampling switches ($\Phi_{1a}$) 156 are both closed. The 1b/cycle shorting switches 152 can remain closed (but they do not have to) during the sampling process, but they should be opened before the next conversion cycle begins with the first 2b/cycle conversion step of the following sample. With both the top-plate sampling switches ($\Phi_{1a}$) 156 and the 1b/cycle shorting switches (1b) 152 closed, all comparator inputs are shorted, i.e., all comparators 132, 134, 136 see zero volts at their differential input (ideally assuming perfect settling).

Figure 7A:
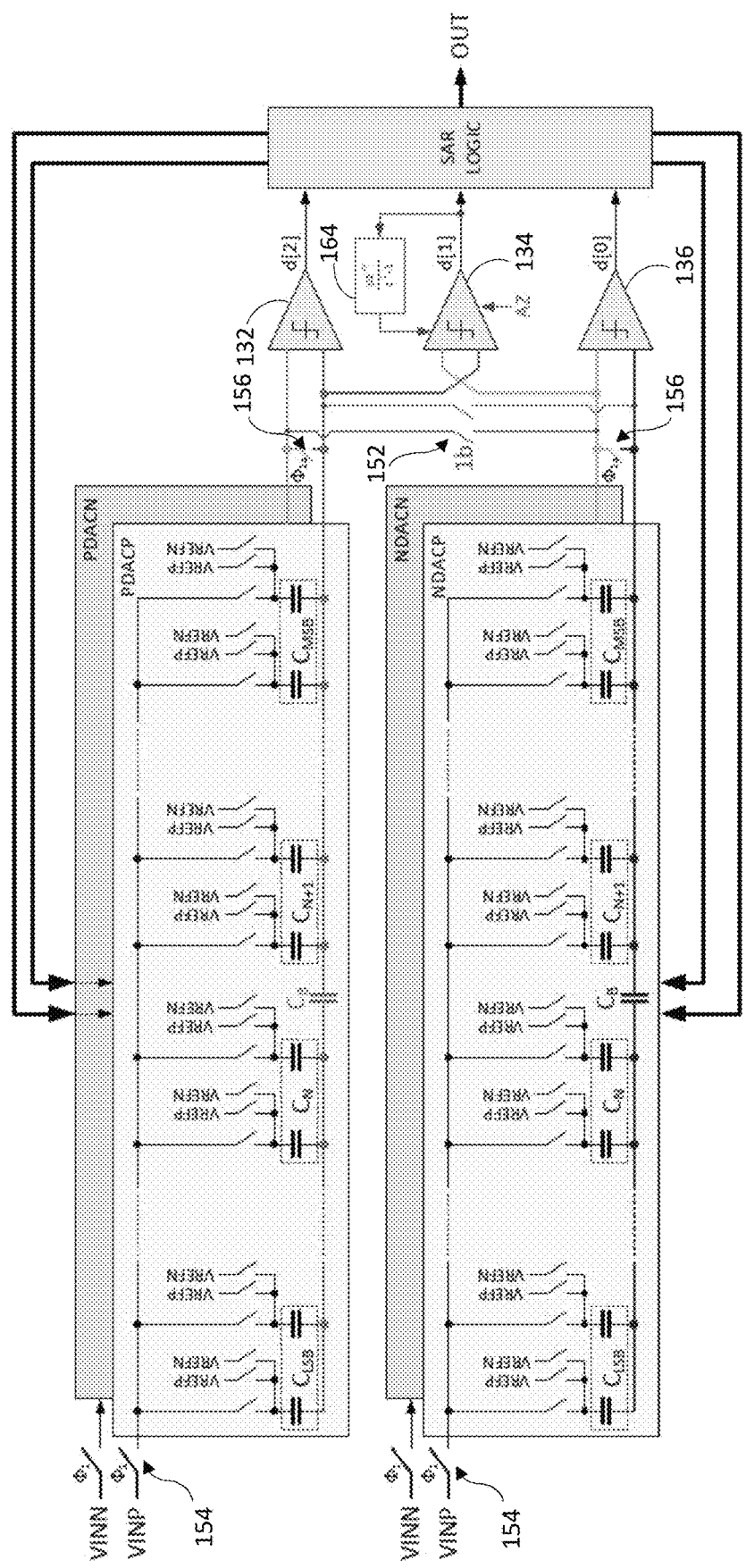
FIG. 7A shows an example scheme for autozero decision and DC-offset correction for the middle comparator.
Figure 7B:
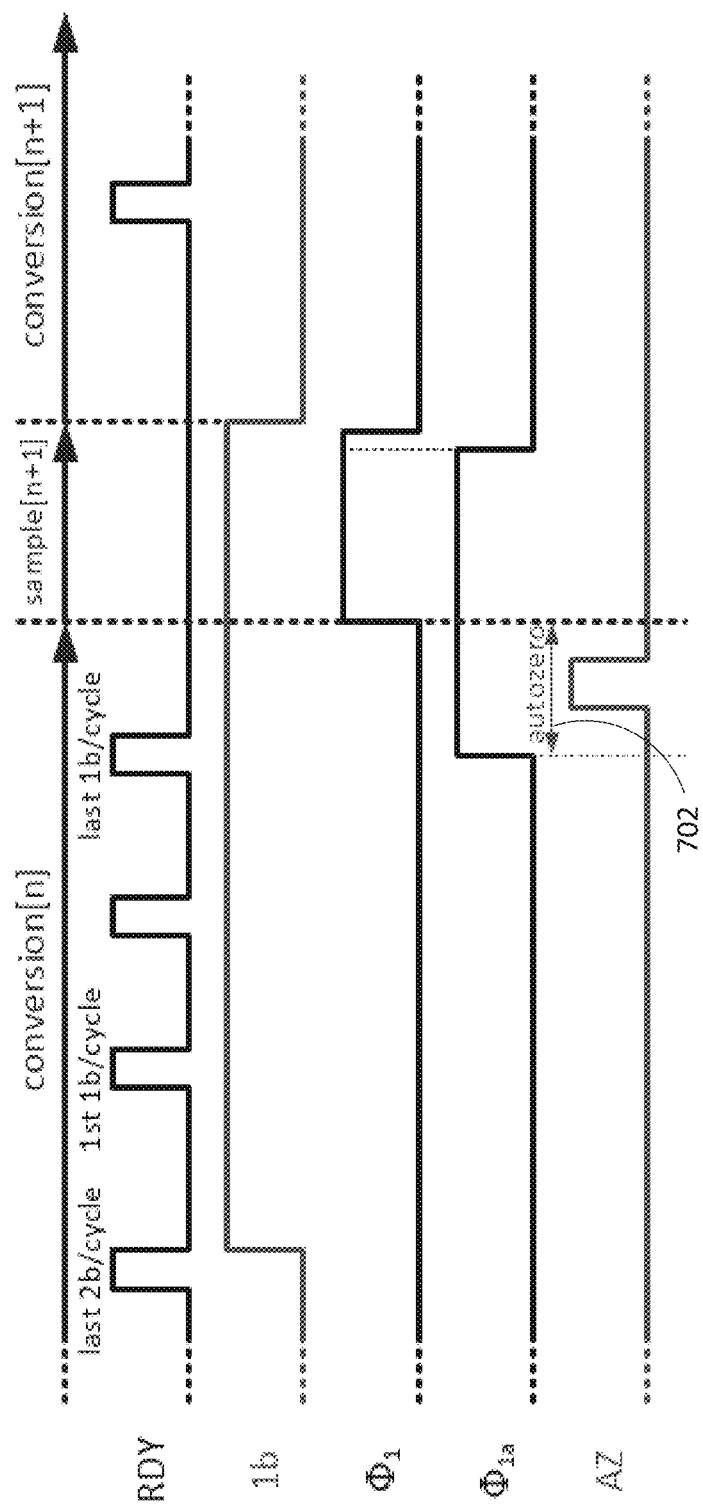
FIG. 7B shows a signaling diagram of control signals for switches.
Figure 8:
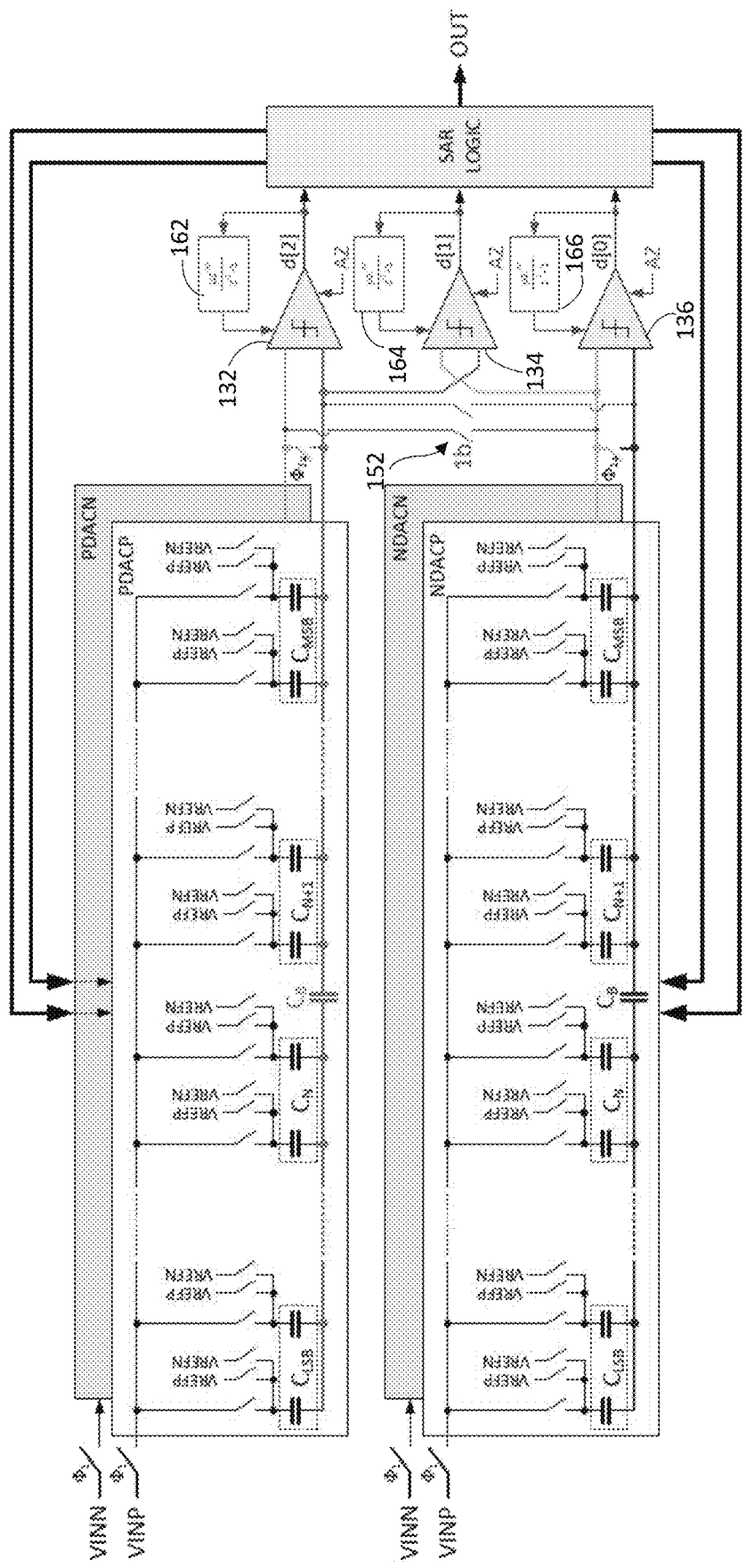
FIG. 8 shows autozero decision and DC-offset correction for all comparators at the end of the SAR conversion process.
Figure 9:
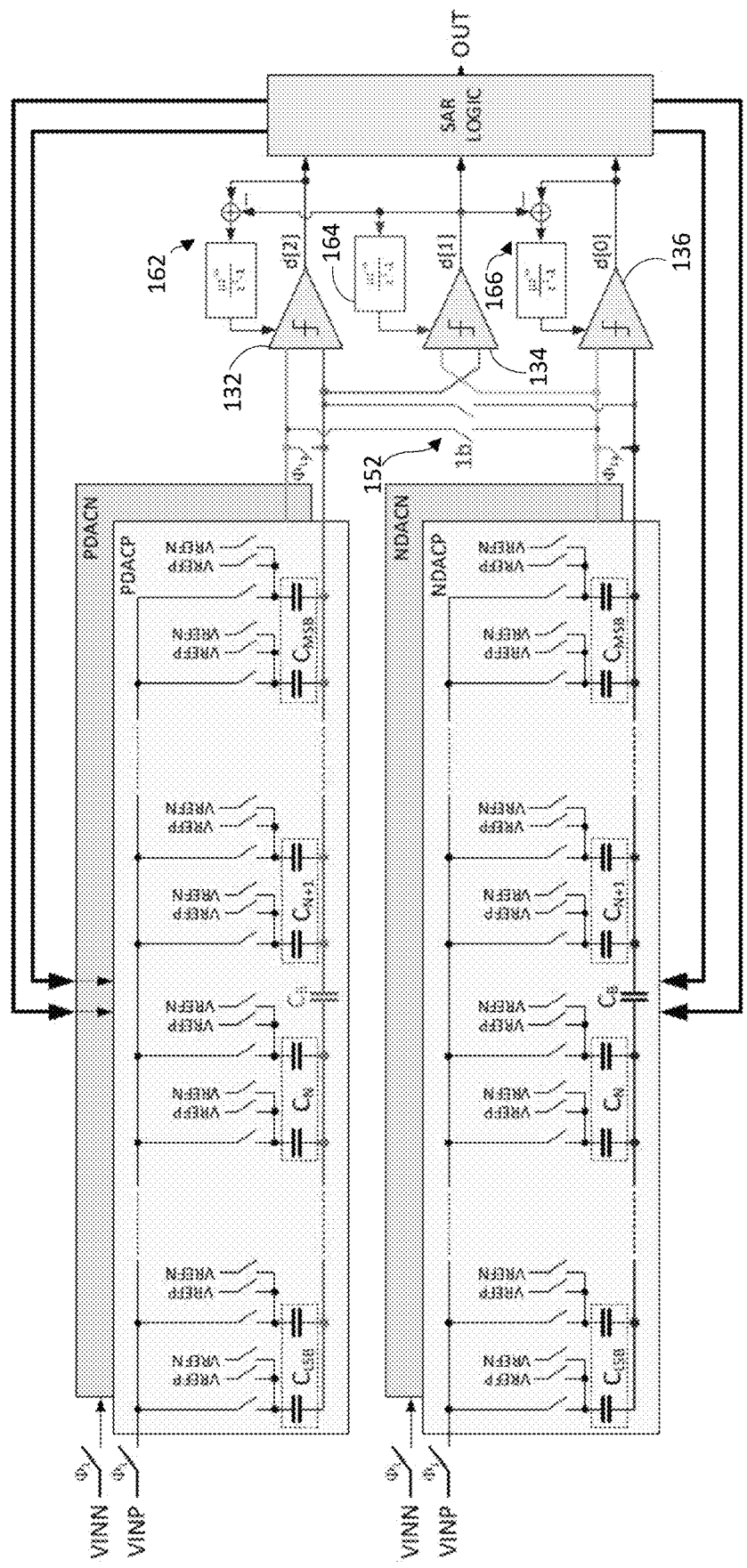
FIG. 9 shows autozero decision and DC-offset correction for the middle comparator 134 and tracking of the middle comparator offset by the outer comparators.

FIG. 7A shows an example scheme for autozero decision and DC-offset correction for the middle comparator 134 at the end of the SAR conversion process reusing the early activated top-plate sampling switch 156 and the 1b/cycle shorting switches 152 to short the comparator inputs. FIG. 7B shows a signaling diagram of control signals for switches 152, 154, 156. In examples, the top-plate sampling switches ($\Phi_{1a}$) 156 may be closed earlier than the input sampling switches ($\Phi_1$) 154, and the short time interval 702 with all comparator inputs being shorted before closing the input sampling switches ($\Phi_1$) 154 may be utilized to force at least the middle comparator 134 to generate an additional decision and use this "auto-zero" decision to operate a feedback loop 164 (DC offset correction loop) that forces the respective comparator DC offset to zero. For example, the DC-offset (and partial 1/f-noise) correction loop 164 may include a digital filter with lowpass character, which drives an appropriate offset actuator inside the comparator 134. The offset actuator can, for example, include small capacitors or small current sources appropriately connected to (differential) internal comparator nodes to minimize the DC-offset (and suppress a portion of the low-frequency 1/f-noise). In FIGS. 7-9, the feedback loop 162, 164, 166 is represented by a digital integrator (counter) with additional delay (M) and (digital-to-analog) scaling factor μ. The analog actuator is inside the comparator and is not shown. A more complex digital filter (e.g., a higher order filter) is also possible, at the expense of circuit complexity and silicon area.

FIG. 8 shows autozero decision and DC-offset correction for all comparators 132, 134, 136 at the end of the SAR conversion process. In some examples, a concurrent auto-zero decision may be forced for all comparators 132, 134, 136, including a full dummy comparator 139 if included, since during the autozero window 702 shown in FIG. 7B, all comparator inputs are shorted. As shown in FIG. 8, each comparator 132, 134, 136 may have its own feedback loop 162, 164, 166, respectively, and all comparators 132, 134, 136 (including the full dummy comparator 139) may be forced to generate an additional decision and use this "auto-zero" decision to operate a respective feedback loop 162, 164, 166 to force the respective comparator DC offset to zero. The dummy comparator input stage for load balancing does not need autozero offset correction, but a full extra comparator for an additional decision during the 1b/cycle steps would.

In some examples, to minimize the comparator offsets, a differential background offset tracking may be used for the outer comparators 132, 136. During the 1b/cycle conversion steps the input voltage (and the nominal decision thresholds) are equal for all comparators 132, 134, 136. Therefore, with the middle comparator 134 as the reference, whose DC-offset is corrected by processing the autozero decision with the shorted inputs generated right before the next input sample is taken as explained above, any difference in the comparator decisions during the 1b/cycle steps can be interpreted as an offset-error of the outer comparators 132, 136, and the difference between the outer comparator decision and the middle comparator decision during any 1b/cycle conversion step may be taken as the input to a background DC-offset tracking loop for that particular outer comparator 132, 136.

FIG. 9 shows autozero decision and DC-offset correction for the middle comparator 134 and tracking of the middle comparator offset by the outer comparators. The outer comparators 132, 136 track the offset of the middle comparator 134. The feedback loop 162, 166 for the outer comparators 132, 136 includes an adder for comparing the decision of the outer comparators 132, 136 with the decision from the middle comparator 134 during the 1b/cycle conversion steps, where all comparators 132, 134, 136 have the same input voltage. The difference between the outer comparator decision and the middle comparator decision is then taken as the input to the feedback loop 162, 166 for that particular outer comparator 132, 136, respectively. The outer comparator feedback loops 162, 166 (DC-offset tracking loops) may be updated using the results from either one or more than one of the previous 1b/cycle conversion steps.

Figure 10:
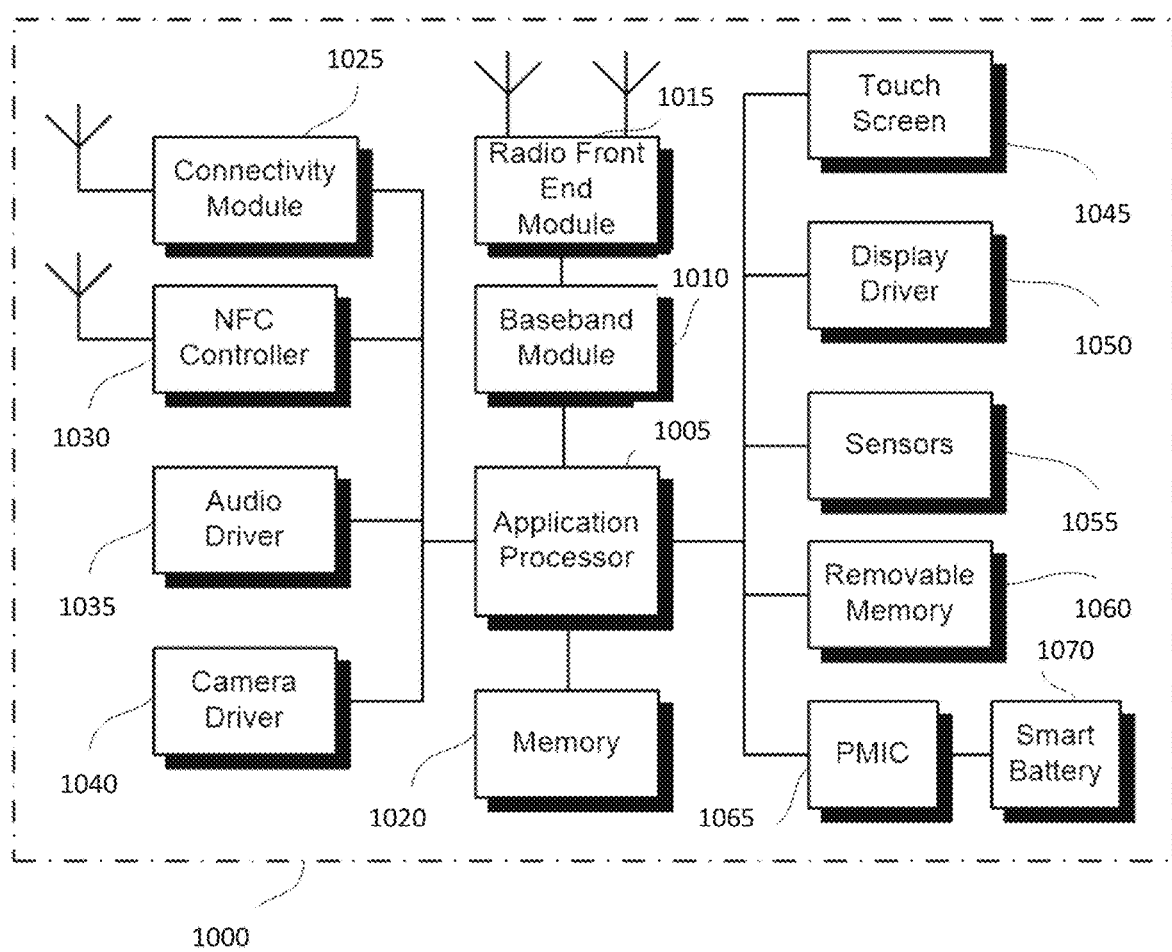
FIG. 10 illustrates a user device in which the examples disclosed herein may be implemented.

FIG. 10 illustrates a user device 1000 in which the examples disclosed herein may be implemented. For example, the examples disclosed herein may be implemented in the radio front-end module 1015, in the baseband module 1010, etc. The user device 1000 may be a mobile device in some aspects and includes an application processor 1005, baseband processor 1010 (also referred to as a baseband module), radio front end module (RFEM) 1015, memory 1020, connectivity module 1025, near field communication (NFC) controller 1030, audio driver 1035, camera driver 1040, touch screen 1045, display driver 1050, sensors 1055, removable memory 1060, power management integrated circuit (PMIC) 1065 and smart battery 1070.

In some aspects, application processor 1005 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 1010 may be implemented, for example, as a solder-down substrate including one or more integrated circuits, a single packaged integrated circuit soldered to a main circuit board, and/or a multi-chip module containing two or more integrated circuits.

Figure 11:
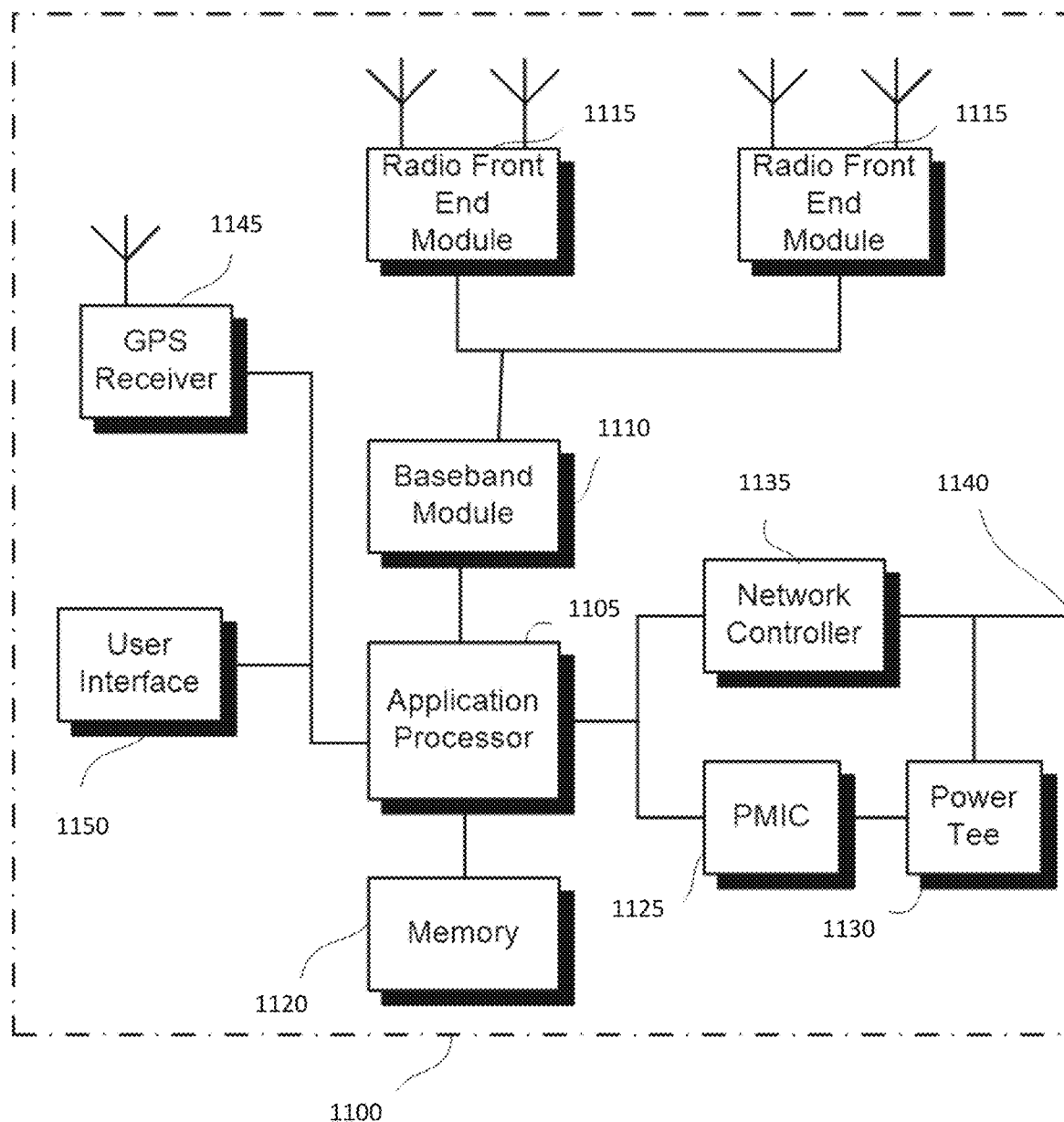
FIG. 11 illustrates a base station or infrastructure equipment radio head in which the examples disclosed herein may be implemented.

FIG. 11 illustrates a base station or infrastructure equipment radio head 1100 in which the examples disclosed herein may be implemented. For example, the examples disclosed herein may be implemented in the radio front-end module 1115, in the baseband module 1110, etc. The base station radio head 1100 may include one or more of application processor 1105, baseband modules 1110, one or more radio front end modules 1115, memory 1120, power management circuitry 1125, power tee circuitry 1130, network controller 1135, network interface connector 1140, satellite navigation receiver module 1145, and user interface 1150.

In some aspects, application processor 1105 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 1110 may be implemented, for example, as a solder-down substrate including one or more integrated circuits, a single packaged integrated circuit soldered to a main circuit board or a multi-chip module containing two or more integrated circuits.

In some aspects, memory 1120 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 1120 may be implemented as one or more of solder down packaged integrated circuits, socketed memory modules and plug-in memory cards.

In some aspects, power management integrated circuitry 1125 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 1130 may provide for electrical power drawn from a network cable to provide both power supply and data connectivity to the base station radio head 1100 using a single cable.

In some aspects, network controller 1135 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 1145 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 1145 may provide data to application processor 1105 which may include one or more of position data or time data. Application processor 1105 may use time data to synchronize operations with other radio base stations.

In some aspects, user interface 1150 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows:

An example (e.g., example 1) relates to an SAR ADC, comprising a plurality of differential C-DACs, wherein each differential C-DAC comprises a pair of C-DACs for positive and negative polarities and each C-DAC comprises a capacitor array including a plurality of capacitors coupled in parallel to an output node of each C-DAC, wherein a capacitor for each bit position in each C-DAC comprises a pair of equal-sized capacitors. The SAR ADC further includes a plurality of comparators including two or more outer comparators and at least one middle comparator, wherein each outer comparator is coupled to one of the differential C-DACs and the middle comparator is coupled to a differential output node pair of C-DACs from two differential C-DACs, and an SAR controller configured to generate a control signal for the plurality of differential C-DACs for each conversion step based on outputs of the comparators, wherein the SAR controller is configured to perform one or more multi-bit per cycle conversions and then at least one single-bit per cycle conversion for converting an analog input signal to a digital signal, wherein the outputs of the comparators are provided to the differential C-DACs as the control signal without encoding.

Another example (e.g., example 2) relates to a previously described example (e.g., example 1), wherein the SAR controller is configured to pre-charge one of the pair of capacitors in each bit position to a positive reference voltage and the other of the pair of capacitors in each bit position to a negative reference voltage and toggle a most significant bit of multiple bits under evaluation of the differential C-DACs to the positive reference voltage and the negative reference voltage, respectively before strobing the comparators.

Another example (e.g., example 3) relates to a previously described example (e.g., any one of examples 1-2), further comprising single-bit/cycle shorting switches for shorting top plates of capacitors of the C-DACs of same polarity, wherein the single-bit/cycle shorting switches are closed during a single-bit/cycle conversion.

Another example (e.g., example 4) relates to a previously described example (e.g., example 3), wherein the SAR controller is configured to generate the control signal based on outputs of all comparators during the single-bit/cycle conversion.

Another example (e.g., example 5) relates to a previously described example (e.g., example 4), wherein the SAR controller is configured to generate the output of the comparators by majority voting of the outputs of all comparators.

Another example (e.g., example 6) relates to a previously described example (e.g., any one of examples 3-5), further comprising additional comparator coupled to another differential output node pair from the two differential C-DACs.

Another example (e.g., example 7) relates to a previously described example (e.g., example 6), wherein the additional comparator is a dummy comparator structure to replicate loading of the middle comparator for the other differential output node pair.

Another example (e.g., example 8) relates to a previously described example (e.g., example 6), wherein the additional comparator is a full comparator coupled to another differential output node pair from the two differential C-DACs and configured to generate an output during the single-bit/cycle conversion.

Another example (e.g., example 9) relates to a previously described example (e.g., any one of examples 3-8), further comprising a feedback loop for the middle comparator, wherein a top-plate shorting switch for shorting top plates of the pair of C-DACs for each differential C-DAC is closed before an input sampling switch for sampling the analog input signal to provide an autozero time window, and a DC offset correction of the middle comparator is performed via the feedback loop based on an output generated by the middle comparator during the autozero time window.

Another example (e.g., example 10) relates to a previously described example (e.g., example 9), further comprising a second feedback loop for each outer comparator, wherein the DC offset correction is performed for each outer comparator via the second feedback loop based on an output generated by each outer comparator during the autozero time window.

Another example (e.g., example 11) relates to a previously described example (e.g., example 10), wherein the DC offset correction for the outer comparator is performed based on a difference between the output generated by the middle comparator and the output generated by each outer comparator.

Another example (e.g., example 12) relates to a previously described example (e.g., example 11), wherein the second feedback loop is updated based on the difference in conversion result between the middle comparator and the outer comparator for at least one previous single-bit/cycle conversion step.

Another example (e.g., example 13) relates to a previously described example (e.g., any one of examples 1-12), wherein top plates of the capacitors in each C-DAC are coupled to the output node in parallel and the analog input signal is sampled to bottom plates of the capacitors.

Another example (e.g., example 14) relates to a previously described example (e.g., any one of examples 1-13), wherein the capacitor array in each C-DAC is split into two segments that are coupled via a bridge capacitor.

Another example (e.g., example 15) relates to a user equipment including the SAR ADC as in any one of examples 1-14.

Another example (e.g., example 16) relates to a base station including the SAR ADC as in any one of examples 1-14.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A successive approximation register (SAR) analog-to-digital converter (ADC), comprising:
  a plurality of differential capacitive digital-to-analog converters (C-DACs), wherein each differential C-DAC comprises a pair of C-DACs for positive and negative polarities and each C-DAC comprises a capacitor array including a plurality of capacitors coupled in parallel to an output node of each C-DAC, wherein a capacitor for each bit position in each C-DAC comprises a pair of equal-sized capacitors;
  a plurality of comparators including two or more outer comparators and at least one middle comparator, wherein each outer comparator is coupled to one of the differential C-DACs and the middle comparator is coupled to a differential output node pair of C-DACs from two differential C-DACs; and
  an SAR controller configured to generate a control signal for the plurality of differential C-DACs for each conversion step based on outputs of the comparators, wherein the SAR controller is configured to perform one or more multi-bit per cycle conversions and then at least one single-bit per cycle conversion for converting an analog input signal to a digital signal, wherein the outputs of the comparators are provided to the differential C-DACs as the control signal without encoding.

2. The SAR ADC of claim 1, wherein the SAR controller is configured to pre-charge one of the pair of capacitors in each bit position to a positive reference voltage and the other of the pair of capacitors in each bit position to a negative reference voltage and toggle a most significant bit of multiple bits under evaluation of the differential C-DACs to the positive reference voltage and the negative reference voltage, respectively before strobing the comparators.

3. The SAR ADC of claim 1, further comprising single-bit/cycle shorting switches for shorting top plates of capacitors of the C-DACs of same polarity, wherein the single-bit/cycle shorting switches are closed during a single-bit/cycle conversion.

4. The SAR ADC of claim 3, wherein the SAR controller is configured to generate the control signal based on outputs of all comparators during the single-bit/cycle conversion.

5. The SAR ADC of claim 4, wherein the SAR controller is configured to generate the output of the comparators by majority voting of the outputs of all comparators.

6. The SAR ADC of claim 3, further comprising additional comparator coupled to another differential output node pair from the two differential C-DACs.

7. The SAR ADC of claim 6, wherein the additional comparator is a dummy comparator structure to replicate loading of the middle comparator for the other differential output node pair.

8. The SAR ADC of claim 6, wherein the additional comparator is a full comparator coupled to another differential output node pair from the two differential C-DACs and configured to generate an output during the single-bit/cycle conversion.

9. The SAR ADC of claim 3, further comprising a feedback loop for the middle comparator, wherein a top-plate shorting switch for shorting top plates of the pair of C-DACs for each differential C-DAC is closed before an input sampling switch for sampling the analog input signal to provide an autozero time window, and a DC offset correction of the middle comparator is performed via the feedback loop based on an output generated by the middle comparator during the autozero time window.

10. The SAR ADC of claim 9, further comprising a second feedback loop for each outer comparator, wherein the DC offset correction is performed for each outer comparator via the second feedback loop based on an output generated by each outer comparator during the autozero time window.

11. The SAR ADC of claim 10, wherein the DC offset correction for the outer comparator is performed based on a difference between the output generated by the middle comparator and the output generated by each outer comparator.

12. The SAR ADC of claim 11, wherein the second feedback loop is updated based on the difference in conversion result between the middle comparator and the outer comparator for at least one previous single-bit/cycle conversion step.

13. The SAR ADC of claim 1, wherein top plates of the capacitors in each C-DAC are coupled to the output node in parallel and the analog input signal is sampled to bottom plates of the capacitors.

14. The SAR ADC of claim 1, wherein the capacitor array in each C-DAC is split into two segments that are coupled via a bridge capacitor.

15. A user equipment including the SAR ADC of claim 1.

16. A base station including the SAR ADC of claim 1.

* * * * *